(12) United States Patent
Suzuki

(10) Patent No.: US 7,106,896 B2
(45) Date of Patent: Sep. 12, 2006

(54) ID RECOGNITION APPARATUS AND ID RECOGNITION SORTER SYSTEM FOR SEMICONDUCTOR WAFER

(75) Inventor: Eiko Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 611 days.

(21) Appl. No.: 09/828,003

(22) Filed: Apr. 6, 2001

(65) Prior Publication Data

US 2002/0021837 A1    Feb. 21, 2002

(30) Foreign Application Priority Data

Apr. 7, 2000    (JP)    ............... 2000-106180

(51) Int. Cl.
    *G06K 9/00*    (2006.01)
(52) U.S. Cl. .................. 382/144; 382/145; 382/147; 382/181
(58) Field of Classification Search ........ 382/144–145, 382/147, 157, 149, 310, 181, 182
    See application file for complete search history.

(56) References Cited

U.S. PATENT DOCUMENTS

| | | | |
|---|---|---|---|
| 4,499,595 A | * | 2/1985 | Masaitis et al. ............ 382/177 |
| 5,909,276 A | * | 6/1999 | Kinney et al. ............ 356/237.2 |
| 6,236,903 B1 | * | 5/2001 | Kim et al. ................... 700/121 |
| 6,697,517 B1 | * | 2/2004 | Hunter ....................... 382/149 |
| 6,707,544 B1 | * | 3/2004 | Hunter et al. ............ 356/237.5 |

FOREIGN PATENT DOCUMENTS

| | | |
|---|---|---|
| JP | 2000-55820 | 2/2000 |
| KR | 1998-016060 | 5/1998 |

* cited by examiner

*Primary Examiner*—Jingge Wu
*Assistant Examiner*—Brian Le
(74) *Attorney, Agent, or Firm*—Scully, Scott, Murphy & Presser, P.C.

(57) ABSTRACT

A semiconductor wafer ID recognition apparatus includes an image sensing optical section and recognition processing section. The image sensing optical section reads at least one identification information (ID) marked at an arbitrary position on a semiconductor wafer in accordance with a plurality of first read optical conditions registered in advance. The recognition processing section performs recognition processing including calculation of an evaluation score representing a read likelihood ratio for an image output from the image sensing optical section every read optical condition, and adopts a recognition result under a read optical condition exhibiting the highest score as an ID of the semiconductor wafer.

11 Claims, 4 Drawing Sheets

ID RECOGNITION APPARATUS AND ID RECOGNITION SORTER SYSTEM FOR SEMICONDUCTOR WAFER

BACKGROUND OF THE INVENTION

The present invention relates to a semiconductor wafer ID recognition apparatus for recognizing identification information (ID) formed at an arbitration position on a semiconductor wafer, and a semiconductor wafer ID recognition sorter system for transferring the semiconductor wafer to a predetermined position on the basis of the ID recognized by the ID recognition apparatus.

In general, the surface of a semiconductor wafer has a character or sign as identification information (ID) for identifying the semiconductor wafer. The character or sign is formed from a material having a reflectivity different from that of the surface of the semiconductor wafer or is formed by shaving the surface of the semiconductor wafer.

As disclosed in Japanese Patent Laid-Open No. 7-296147 (reference 1), an ID recognition apparatus for automatically recognizing an ID formed at an arbitrary position on a semiconductor wafer has conventionally been known. The ID recognition apparatus disclosed in reference 1 uses a light-receiving element to receive light reflected by the surface of a semiconductor wafer illuminated by an illumination means, uses a recognition means to process an image obtained by the light-receiving element, and thus recognizes an ID.

An ID recognition sorter for performing sorting operation of transferring a semiconductor wafer to a predetermined position has conventionally been known. This sorter is manually operated because of the existence of a wafer state in which an ID is difficult to read in the process. Recently, demands have arisen for automatic read of a wafer ID and sorting operation which can operate online. Automatic read of a wafer ID can use the ID recognition technique described in the ID recognition apparatus.

A conventional ID recognition apparatus reads the ID of a semiconductor wafer under a plurality of preset read optical conditions, then calculates a score representing a read likelihood ratio for each read optical condition, and adopts an recognition result whose score exceeds a predetermined acceptable score, as the ID of the semiconductor wafer.

If, however, this acceptable score is set too low, many mistakes occur; if the score is set too high, no ID can be determined. The conventional ID recognition apparatus sets the acceptable score around 70 in consideration of this situation. In practice, even this score causes many mistakes. Particularly when the lateral stripe of a pattern or the like overlaps a wafer ID, the ratio of character mistakes increases. If a wafer ID is mistaken, the ID recognition sorter using the ID recognition technique erroneously performs sorting operation.

SUMMARY OF THE INVENTION

It is an object of the present invention to provide an ID recognition apparatus capable of always determining an accurate wafer ID in a wafer state which changes variously.

It is another object of the present invention to provide an ID recognition sorter system capable of automatically, accurately performing sorting operation.

To achieve the above objects, according to the present invention, there is provided a semiconductor wafer ID recognition apparatus comprising image sensing optical means for reading at least one identification information (ID) marked at an arbitrary position on a semiconductor wafer in accordance with a plurality of first read optical conditions registered in advance, and recognition processing means for performing recognition processing including calculation of an evaluation score representing a read likelihood ratio for an image output from the image sensing optical means every read optical condition, and adopting a recognition result under a read optical condition exhibiting the highest score as an ID of the semiconductor wafer.

DESCRIPTION OF THE PREFERRED EMBODIMENTS

The present invention will be described in detail below with reference to the accompanying drawings.

Figure 1A:
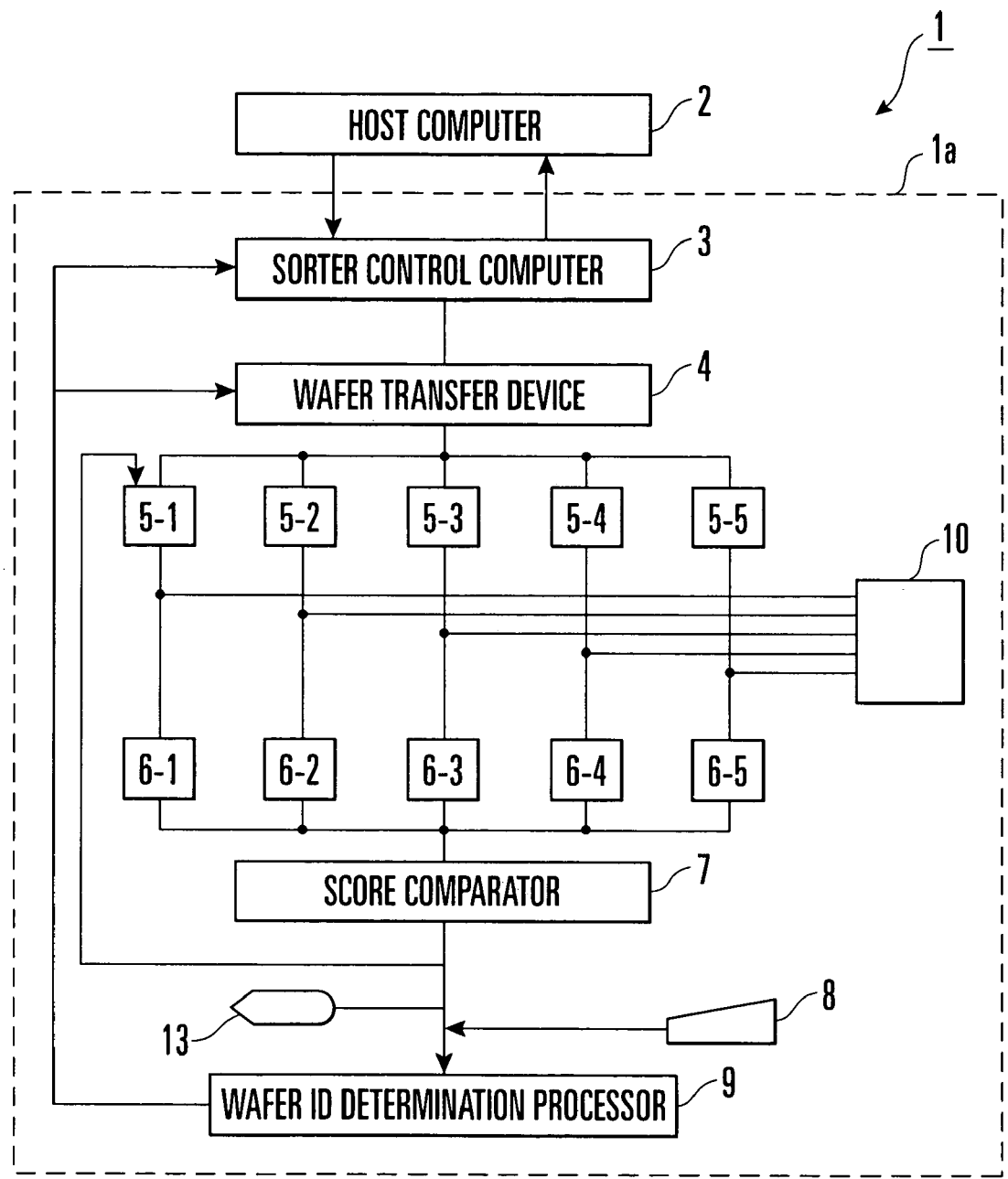
FIGS. 1A and 1B are block diagrams, respectively, showing the arrangements of the signal processing system and image sensing optical system of an ID recognition sorter system according to the first embodiment of the present invention.
Figure 1B:
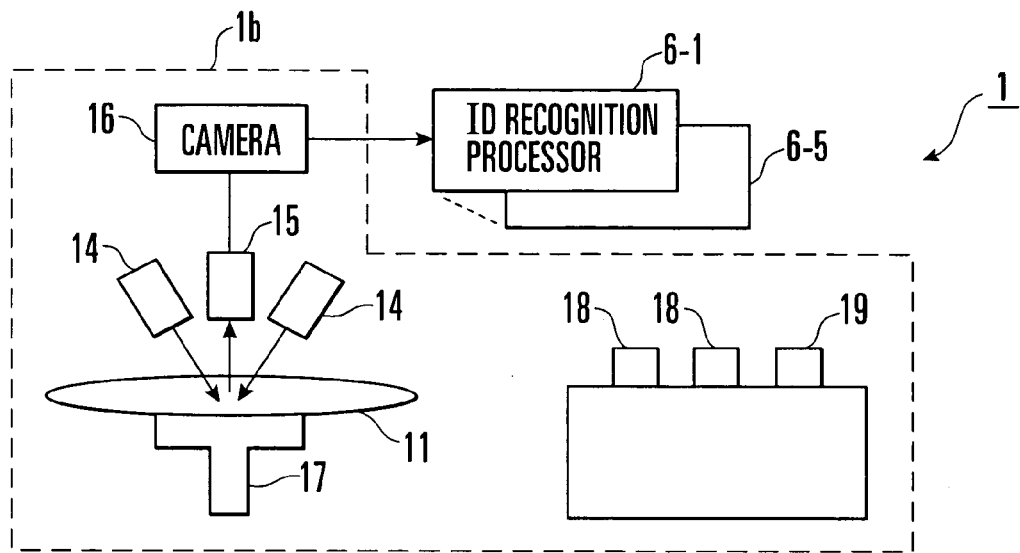

FIGS. 1A and 1B show an ID recognition sorter system according to the first embodiment of the present invention. The ID recognition sorter system of the first embodiment is constituted by a signal processing system shown in FIG. 1A and an image sensing optical system shown in FIG. 1B. The signal processing system has a signal processing section 1a and a host computer 2 for controlling the overall system. The optical system has an image sensing optical section 1b. The signal processing section 1a and image sensing optical section 1b constitute a wafer ID recognition sorter 1.

As shown in FIG. 1A, the signal processing section 1a comprises a sorter control computer 3 for controlling the entire wafer ID recognition sorter 1, a wafer transfer device 4 for transferring a semiconductor wafer to a predetermined position on the basis of a recognized ID, read optical condition memories (to be referred to as condition memories hereinafter) 5-1 to 5-5 for storing a plurality of read optical conditions, a plurality of ID recognition processors 6-1 to 6-5 for performing ID recognition processing by using an output from the image sensing optical section 1b under respective read optical conditions, a score comparator 7 for comparing evaluation scores stored in the ID recognition processors 6-1 to 6-5, a wafer ID input unit 8 for manually inputting an ID when no ID can be recognized by automatic read under a plurality of read optical conditions registered in advance, a wafer ID determination processor 9 for determining, as the ID of a semiconductor wafer, a recognition result under a read optical condition exhibiting the highest evaluation score, a camera illumination controller 10 for controlling the light source of the image sensing optical system so as to set read optical conditions stored in the condition memories 5-1 to 5-5, and an image display 13 serving as an informing means for generating a warning when no ID can be recognized.

Figure 2:
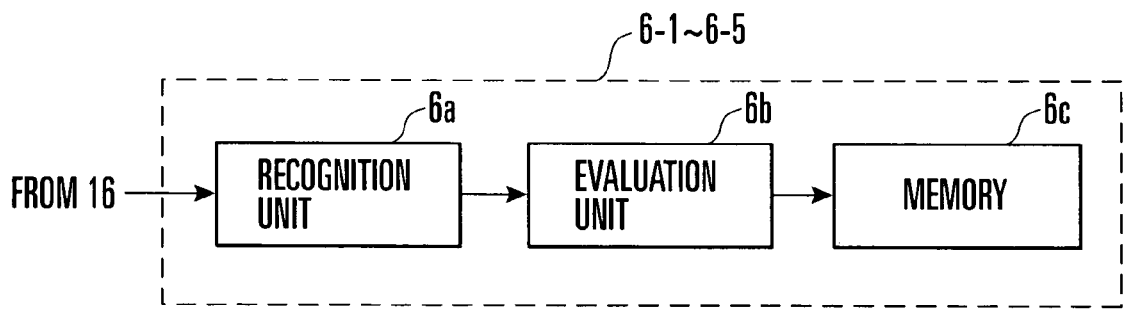
FIG. 2 is a block diagram showing an ID recognition processor shown in FIGS. 1A and 1B.

As shown in FIG. 2, each of the ID recognition processors 6-1 to 6-5 has a recognition unit 6a for performing recognition processing for respective images obtained under a plurality of read optical conditions, an evaluation unit 6b for calculating an evaluation score representing a read likelihood ratio for each read optical condition on the basis of the recognition result of the recognition unit 6a, and a memory 6c for storing the recognition result and evaluation score.

As shown in FIG. 1B, the image sensing optical section 1b comprises light sources 14 which are arranged to illuminate an ID on a semiconductor wafer and can change read optical conditions, a lens 15 for condensing light reflected by the semiconductor wafer, a camera 16 serving as an image sensing means for reading an ID and outputting it to each ID recognition processor 6, and a wafer table 17 serving as an ID read stage. Reference numeral 18 denotes each loader cassette unit for storing a semiconductor wafer which has not undergone ID recognition processing yet and a semiconductor wafer which has already undergone ID recognition processing; and 19, a buffer cassette unit for temporarily storing a semiconductor wafer whose ID cannot be recognized.

The sorter control computer 3 incorporates ID recognition software. The wafer ID recognition sorter 1 determines the ID of a wafer to be sorted under the control of the sorter control computer 3 complying with the ID recognition software. The robot arm of the wafer transfer device 4 transfers a semiconductor wafer to a designated carrier slot of the loader cassette unit 18 on the basis of the determined ID.

More specifically, the wafer ID recognition sorter 1 repetitively inspects an ID under a plurality of read optical conditions registered in advance, and compares evaluation scores each representing a read likelihood ratio under each read optical condition at the last of inspection. The wafer ID recognition sorter 1 recognizes, as the ID of the wafer, a read result having the highest score equal to or higher than an arbitrarily set acceptable score (reference score).

If a character string is not determined at that time, e.g., if an evaluation score does not reach the acceptable score, the wafer ID recognition sorter 1 enters a retry sequence and searches for an optical condition under which an ID can be read while changing read optical conditions. The wafer ID recognition sorter 1 sets, as the ID of the wafer, a read result having the highest score equal to or higher than the acceptable score.

If no read result can be determined even at that time, the sorter control computer 3 designates generation of an operator call alarm. In this case, the operator manually inputs an actual ID while watching the camera image of an ID displayed on the image display 13 of the wafer ID recognition sorter 1.

Figure 3:
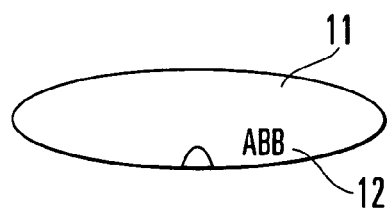
FIG. 3 is a perspective view showing a semiconductor wafer used in the ID recognition sorter system according to the first embodiment.

The operation of the ID recognition sorter system having this arrangement will be explained. The following description concerns a semiconductor wafer 11 on which alphanumeric characters are stamped as a wafer ID 12 on the right of the surface, as shown in FIG. 3.

When a cassette which stores the semiconductor wafer 11 proceeds to a wafer ID inspection step in the semiconductor manufacturing process, an AGV (Automatic Guided Vehicle; not shown) transfers the cassette to the loader cassette unit 18 of the wafer ID recognition sorter 1 under the control of the host computer 2. The host computer 2 supplies wafer process information and an inspection program to the sorter control computer 3 of the wafer ID recognition sorter 1.

Under the control of the sorter control computer 3, the wafer transfer device 4 extracts a semiconductor wafer 11 to be inspected from the cassette stored in the loader cassette unit 18, and transfers the extracted semiconductor wafer 11 onto the wafer table 17 serving as an ID read stage. At this time, the semiconductor wafer 11 is placed on the wafer table 17 with its upper surface facing up and its lower surface facing down.

Subsequently, the sorter control computer 3 moves the light sources 14 and lens 15 to proper positions so as to set a wafer ID position designated by the inspection program to the readable range of the camera 16. Since the wafer ID 12 is stamped on the right of the notch, as described above, the wafer ID 12 is positioned within the readable range of the camera 16.

The sorter control computer 3 sequentially reads out pieces of different read optical information stored in the condition memories 5-1 to 5-5, and sends them to the camera illumination controller 10. The camera illumination controller 10 controls the angles and light quantities of the light sources 14 so as to attain an optical condition designated by each read optical condition information. Illumination light from the light sources 14 illuminates the semiconductor wafer 11 on the wafer table 17 under the designated optical condition. The light reflected by the semiconductor wafer 11 is incident on the camera 16 via the lens 15, and the camera 16 senses the image on the semiconductor wafer 11. An image signal output from the camera 16 is sent to the ID recognition processor 6.

In the ID recognition processor 6, the recognition unit 6a performs wafer ID recognition processing by pattern collation of collating the image sensed by the camera 16 with a character pattern of a character prepared in advance. The evaluation unit 6b calculates an evaluation score representing a matching ratio between the recognition result (character string obtained by wafer ID recognition processing) of the recognition unit 6a and the standard pattern. The memory 6c stores the recognition result of the recognition unit 6a and the evaluation score of the evaluation unit 6b. In general, the wafer ID is a character string of aligned characters. Hence, the evaluation score is calculated by obtaining a score representing the matching ratio between the character string and the standard pattern for each character and calculating the average of such scores.

The first embodiment employs the condition memories 5-1, 5-2, 5-3, 5-4, and 5-5 for storing five read optical conditions, and the ID recognition processors 6-1, 6-2, 6-3, 6-4, and 6-5 in correspondence with them.

The condition memories 5-1, 5-2, 5-3, 5-4, and 5-5 register pieces of different read optical condition information, i.e., pieces of read optical condition information having different ratios between bright field illumination and dark field illumination. The memory 6c of the ID recognition processor 6-1 stores the recognition result and evaluation score of wafer ID recognition processing under an optical condition based on read optical condition information registered in the condition memory 5-1.

Similarly, the memories 6c of the ID recognition processors 6-2, 6-3, 6-4, and 6-5 store the recognition results and evaluation scores of wafer ID recognition processing under read optical conditions registered in the condition memories 5-2, 5-3, 5-4, and 5-5. In this manner, the recognition results and evaluation scores are stored in the memories 6c of all the ID recognition processors 6-1, 6-2, 6-3, 6-4, and 6-5, and recognition processing under all the read optical conditions is completed. Then, the score comparator 7 compares the evaluation scores under the respective read optical conditions.

Assume that the evaluation scores of wafer ID recognition processing under read optical conditions registered in the condition memories 5-1, 5-2, 5-3, 5-4, and 5-5 are 75, 81, 72, 95, and 92, respectively. At this time, the score comparator 7 determines the recognition result under the read optical condition registered in the condition memory 5-4 as a read condition exhibiting the highest score. The score comparator 7 sends the recognition result under the read optical condition registered in the condition memory 5-4, i.e., the character string stored in the ID recognition processor 6-4, as a determined character string to the wafer ID determination processor 9.

The determined character string (wafer ID) is sent from the wafer ID determination processor 9 to the sorter control computer 3. The sorter control computer 3 executes sorting operation of the semiconductor wafer 11 on the basis of the determined wafer ID. Under the control of the sorter control computer 3, the wafer transfer device 4 transfers the semiconductor wafer 11 on the wafer table 17 to a predetermined carrier slot of the loader cassette unit 18.

If the highest evaluation score is under 70, the score comparator 7 determines that the read likelihood ratio is insufficient and no character string can be determined. If the highest evaluation score is 70 or higher, but the recognized character string includes an indistinct character which cannot be satisfactorily recognized, the score comparator 7 determines that this character string is uncertain. In this case, the score comparator 7 notifies the sorter control computer 3 that no character string is determined.

The sorter control computer 3 performs retry processing in accordance with the notification from the score comparator 7. The sorter control computer 3 searches for a readable optical condition by repeating wafer ID recognition processing while changing read optical condition information sent to the camera illumination controller 10. The sorter control computer 3 defines, as a determined character string, a recognition result whose evaluation score is the highest among recognition results under a plurality of optical conditions and is 70 or higher.

The following description is about an operation when no character string can be determined in either wafer ID recognition processing or retry processing under existing read optical conditions registered in the condition memories 5-1 to 5-5 because the highest evaluation score is under 70 or an indistinct character exists.

When no character string is determined in wafer ID recognition processing or retry processing under existing read optical conditions, the sorter control computer 3 suspends processing and displays a warning on the window of the image display 13. Alternatively, an audio output means (not shown) generates an operator call to call the operator. At this time, the window of the image display 13 of the wafer ID recognition sorter 1 displays the camera image of the wafer ID 12, which allows the operator to confirm the image. This image may be an image before or after filtering processing.

While watching the image of the wafer ID 12 displayed on the image display 13, the operator uses a keyboard window displayed on the same window, and complements and inputs an imperfect wafer ID recognized by the wafer ID recognition sorter 1. A character is input by selecting a corresponding key button on the keyboard window with the wafer ID input unit 8 such as a mouse.

After manually inputting the wafer ID, the operator selects an OK key on the keyboard window with the wafer ID input unit 8. By selecting the OK key, the wafer ID determination processor 9 sends the manually input character string as a determined character string to the sorter control computer 3. The sorter control computer 3 executes sorting operation of the semiconductor wafer 11 on the basis of the determined wafer ID.

Figure 4A:
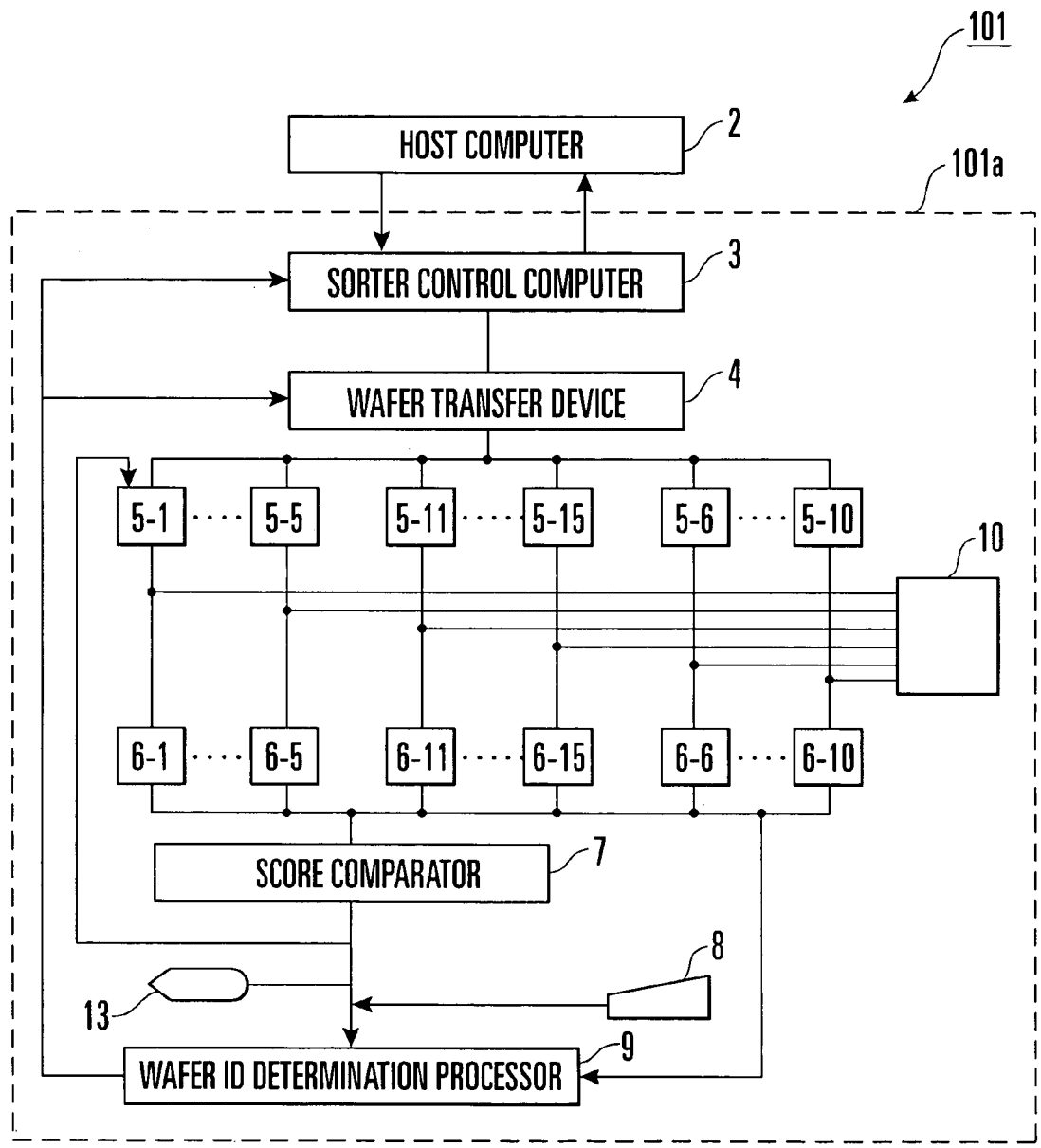
FIGS. 4A and 4B are block diagrams, respectively, showing the arrangements of the signal processing system and image sensing optical system of an ID recognition sorter system according to the second embodiment of the present invention.
Figure 4B:
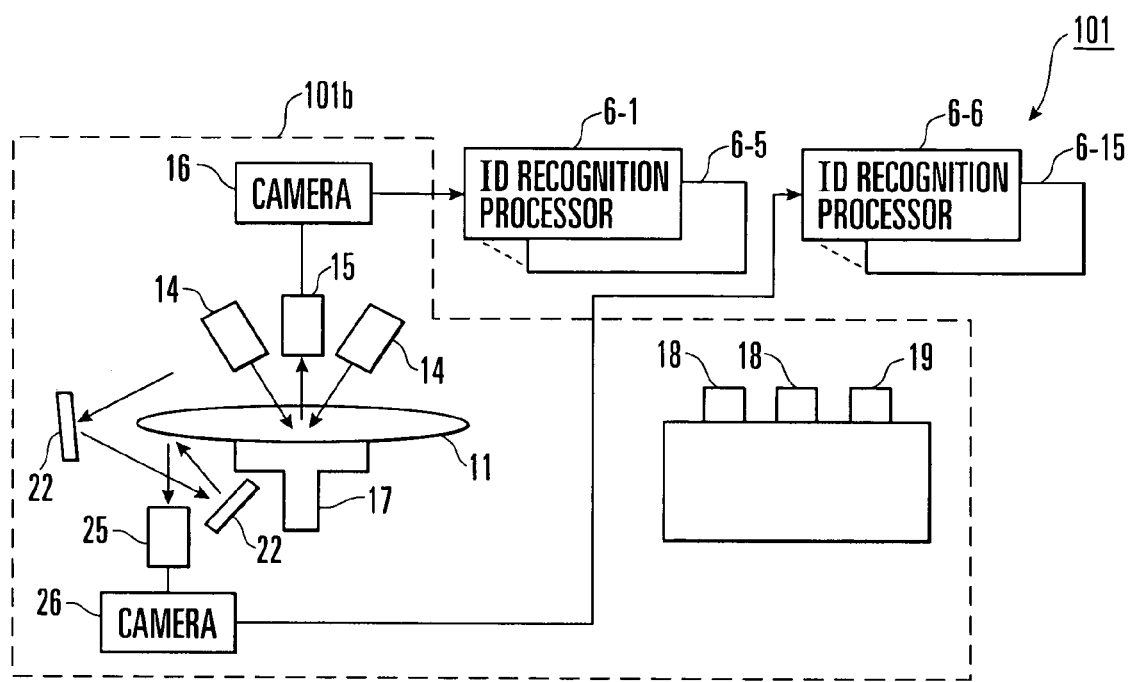
Figure 5:
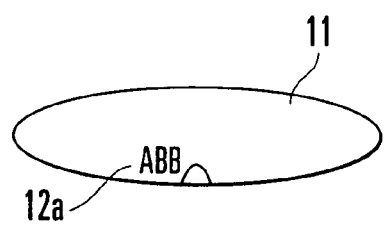
FIG. 5 is a perspective view of a semiconductor wafer used in the ID recognition sorter system according to the second embodiment when viewed from the upper surface.
Figure 6:
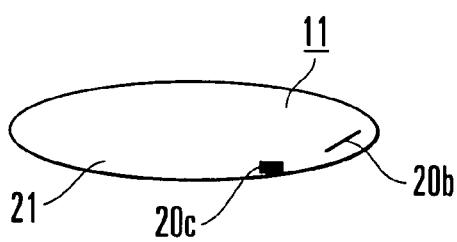
FIG. 6 is a perspective view of the semiconductor wafer used in the ID recognition sorter system according to the second embodiment when viewed from the lower surface.

The sorter control computer 3 repeats this processing until semiconductor wafers 11 which have not been inspected run out in the loader cassette unit 18. After all the semiconductor wafers 11 in the loader cassette unit 18 are processed, the sorter control computer 3 transfers inspection result data to the host computer 2. The AGV unloads the cassette of the loader cassette unit 18 under the control of the host computer FIGS. 4A and 4B show an ID recognition sorter system according to the second embodiment of the present invention. The same reference numerals as in FIGS. 1A, 1B, and 2 denote the same parts. In the second embodiment, a plurality of wafer IDs are stamped on a semiconductor wafer 11. When a notch is positioned in the front direction, as shown in FIG. 5, alphanumeric characters are stamped as a wafer ID 12a on the left of the upper surface of the semiconductor wafer 11. Further, alphanumeric characters and a two-dimensional code are stamped as wafer IDs 20b and 20c on a lower surface 21 of the semiconductor wafer 11, as shown in FIG. 6.

A signal processing section 101a of an ID recognition sorter 101 shown in FIG. 4A is different from the signal processing section 1a shown in FIG. 1A in that the signal processing section 101a comprises condition memories 5-6 to 5-15 in addition to condition memories 5-1 to 5-5, and ID recognition processors 6-6 to 6-15 in correspondence with the condition memories 5-6 to 5-15. The condition memories 5-11 to 5-15 store a plurality of different read optical conditions for the wafer ID 20b, whereas the condition memories 5-6 to 5-10 store a plurality of different read optical conditions for the wafer ID 20c.

An image sensing optical section 101b of the ID recognition sorter 101 shown in FIG. 4B is different from the image sensing optical section 1b shown in FIG. 1B in that the image sensing optical section 101b further comprises a lens 25 for condensing light reflected by the lower surface of a semiconductor wafer, a camera 26 for receiving the image of the lower surface of the wafer via the lens 25 and outputting it to the ID recognition processors 6-6 to 6-10 and 6-11 to 6-15, and reflecting mirrors 22 for reflecting incident light from light sources 14 to the lower surface of the semiconductor wafer 11. The ID recognition processors 6-6 to 6-15 have the same arrangement as that of the ID recognition processors 6-1 to 6-5 shown in FIG. 2.

The operation of the ID recognition sorter system will be explained. After the semiconductor wafer 11 is placed on a wafer table 17, a sorter control computer 3 moves the light sources 14, a lens 15, the lens 25, a camera 16, the camera 26, and the reflecting mirrors 22 to proper positions so as to set a wafer ID position designated by an inspection program to the readable ranges of the cameras 16 and 26.

In wafer ID recognition processing in the second embodiment, the wafer ID on the lower surface of the semiconductor wafer 11, particularly the wafer ID 20c as a two-dimensional code is preferentially processed. For this purpose, the sorter control computer 3 controls a camera illumination controller 10 and moves the light sources 14 and reflecting mirrors 22 so as to illuminate the positions of the wafer IDs 20b and 20c of the semiconductor wafer 11 with illumination light. Further, the sorter control computer 3 moves the lens 25 and camera 26 so as to set the positions of the wafer IDs 20b and 20c to the readable range.

After that, the sorter control computer 3 sequentially reads out pieces of read optical condition information for the wafer ID 20c that are stored in the condition memories 5-6 to 5-10, and sends them to the camera illumination controller 10. The camera illumination controller 10 controls the angles and light quantities of the light sources 14 and the angles of the reflecting mirrors 22 so as to attain an optical condition designated by each read optical condition information.

Light reflected by the semiconductor wafer 11 is incident on the camera 26 via the lens 25, and the camera 26 senses the image of the lower surface of the semiconductor wafer 11. An image signal from the camera 26 is sent to the ID recognition processors 6-6 to 6-10. The ID recognition processors 6-6 to 6-10 perform wafer ID recognition processing by pattern collation of collating the image sensed by the camera 26 with a standard pattern of a two-dimensional code prepared in advance. The ID recognition processors 6-6 to 6-10 store recognition results (character strings represented by a two-dimensional code obtained by wafer ID recognition processing) in their memories 6c.

The recognition results of wafer ID recognition processing under respective read optical conditions registered in the condition memories 5-6 to 5-10 are stored in the corresponding ID recognition processors 6-6 to 6-10. After the recognition results are stored in the ID recognition processors 6-6 to 6-10, recognition processing for the wafer ID 20c ends. To recognize a two-dimensional code, the obtained recognition result is either "true" or "false" (digital evaluation of logic "0" or "1"). Immediately when a correct recognition result is obtained by at least one of the ID recognition processors 6-6 to 6-10, a wafer ID determination processor 9 determines a wafer ID.

The wafer ID determination processor 9 sends the correct recognition result stored in any one of the ID recognition processors 6-6 to 6-10 as a determined wafer ID to the sorter control computer 3. The sorter control computer 3 executes sorting operation of the semiconductor wafer 11 on the basis of the determined wafer ID.

If no correct recognition result can be obtained in any of the ID recognition processors 6-6 to 6-10, the wafer ID determination processor 9 notifies the sorter control computer 3 that the character string is uncertain.

When the wafer ID 20c is preferentially processed but no character string is determined, the sorter control computer 3 targets the wafer ID 12a on the upper surface of the semiconductor wafer 11 and the wafer ID 20b on the lower surface. For this purpose, the sorter control computer 3 controls the camera illumination controller 10 and moves the light sources 14 and reflecting mirrors 22 so as to illuminate the position of the wafer ID 12a on the upper surface of the semiconductor wafer 11 and the position of the wafer ID 20b on the lower surface. Further, the sorter control computer 3 moves the lens 15 and camera 16 so as to set the position of the wafer ID 12a to the readable range, and moves the lens 25 and camera 26 so as to set the position of the wafer ID 20b and 20c to the readable range.

Thereafter, the sorter control computer 3 sequentially reads out pieces of read optical condition information for the wafer ID 12a that are stored in the condition memories 5-1 to 5-5, and sends them to the camera illumination controller 10. The camera illumination controller 10 controls the angles and light quantities of the light sources 14 so as to attain an optical condition designated by each read optical condition information. ID recognition processors 6-1 to 6-5 perform wafer ID recognition processing including calculation (analog evaluation) of an evaluation score by pattern collation of collating the image sensed by the camera 16 with a standard pattern of a character prepared in advance.

In the second embodiment, similar to the first embodiment, the ID recognition processors 6-1 to 6-5 are arranged in correspondence with the condition memories 5-1 to 5-5 for the wafer ID 12a. Recognition results and evaluation scores of wafer ID recognition processing under respective read optical conditions registered in the condition memories 5-1 to 5-5 are stored in memories 6c of the corresponding ID recognition processors 6-1 to 6-5.

The sorter control computer 3 sequentially reads out pieces of read optical condition information for the wafer ID 20b that are stored in the condition memories 5-11 to 5-15, and sends them to the camera illumination controller 10. The camera illumination controller 10 controls the angles and light quantities of the light sources 14 and the angles of the reflecting mirrors 22 so as to attain an optical condition designated by each read optical condition information. The ID recognition processors 6-11 to 6-15 perform wafer ID recognition processing including calculation (analog evaluation) of an evaluation score by pattern collation of collating the image sensed by the camera 26 with a standard pattern of a character prepared in advance.

In the second embodiment, the ID recognition processors 6-11 to 6-15 are arranged in correspondence with the condition memories 5-11 to 5-15. Recognition results and evaluation scores of wafer ID recognition processing under different read optical conditions registered in the condition memories 5-11 to 5-15 are stored in the memories 6c of the corresponding ID recognition processors 6-11 to 6-15.

After the recognition results and evaluation scores are stored in the ID recognition processors 6-1 to 6-5 and 6-11 to 6-15, and recognition processing under all the read optical conditions is completed, a score comparator 7 compares the stored evaluation scores. The score comparator 7 sends to the wafer ID determination processor 9 a recognition result whose evaluation score is the highest among the recognition results stored in the ID recognition processors 6-1 to 6-5 and 6-11 to 6-15, as a determined character string. The determined character string is sent from the wafer ID determination processor 9 to the sorter control computer 3. The sorter control computer 3 executes the same sorting operation as in the first embodiment on the basis of the determined wafer ID.

If the highest evaluation score is under 70 in comparison of the evaluation score, or if the highest evaluation score is 70 or higher but the recognized character string includes an indistinct character which cannot be satisfactorily recognized, the score comparator 7 notifies the sorter control computer 3 that no character string is determined.

The sorter control computer 3 performs retry processing in accordance with this notification. The sorter control computer 3 repeats recognition processing of the wafer IDs 12a and 20b while slightly changing read optical condition information sent to the camera illumination controller 10. With this operation, the sorter control computer 3 searches for a readable optical condition, and defines, as a determined character string, a recognition result whose evaluation score is the highest among recognition results under a plurality of optical conditions and is 70 or higher.

When no character string is determined in either wafer ID recognition processing or retry processing under existing read optical conditions registered in the condition memories 5-1 to 5-5 and 5-11 to 5-15 because the highest evaluation score is under 70 or an indistinct character exists, the sorter control computer 3 suspends processing and outputs an operator call to call the operator. The subsequent operation is completely the same as in the first embodiment, and the operator manually inputs a wafer ID.

In this fashion, an evaluation score representing a read likelihood ratio is obtained by two alphanumeric character strings of wafer IDs on the upper and lower surfaces. Note that the wafer ID to be read may be any one of an alphanumeric character, two-dimensional code, and one-dimensional bar code stamped on the upper surface, lower surface, or side surface of a wafer.

The second embodiment executes ID determination by reading a plurality of types of IDs under various read optical conditions. Hence, more accurate ID determination can be implemented, and the influence of a change in wafer state during the process can be reduced.

The above embodiments have exemplified an ID recognition sorter system for performing sorting operation of a semiconductor wafer. However, the present invention can be exploited as an ID recognition apparatus.

As has been described above, according to the present invention, an ID can be rapidly, accurately determined in any wafer state. Since ID determination is executed after a plurality of IDs are read under various read optical conditions, more accurate ID determination can be implemented, and the influence of a change in wafer state depending on the process can be reduced.

Retry processing enables determining a wafer ID even if automatic read fails under a plurality of read optical conditions registered in advance. The operator can be notified of the ID determination failure by generating a warning when no ID can be recognized by read under a plurality of read optical conditions registered in advance or retry processing.

Even when no wafer ID can be automatically recognized, a wafer ID can be determined, and support of ID recognition by the operator can be expected. An accurate wafer ID can always be determined in a wafer state which changes variously, and sorting operation can be automatically, accurately achieved.

What is claimed is:

1. A semiconductor wafer ID recognition apparatus comprising:
    image sensing optical means for reading a plurality of identification information character strings (IDs) marked at an arbitrary position on a semiconductor wafer in accordance with a plurality of first read optical conditions registered in advance; and
    recognition processing means for performing recognition processing including calculation of an evaluation score representing a read likelihood ratio for an image output from said image sensing optical means for every read optical condition, and for adopting a recognition result for the character string exhibiting the highest score as an ID of the semiconductor wafer under the read optical condition, the highest score being adopted only if it is no less than a predetermined minimum score,
    wherein said recognition processing means performs recognition processing for a corresponding ID among a plurality of IDs recorded on the semiconductor wafer in accordance with the first read optical conditions, and adopts, as the ID of the semiconductor wafer, a recognition result under a read optical condition exhibiting the highest score obtained by recognition processing under all the first read optical conditions.

2. An apparatus according to claim 1, further comprising informing means for generating a warning when no ID can be recognized by recognition processing under the first read optical conditions.

3. An apparatus according to claim 1, further comprising input means for manually inputting an ID when no ID can be recognized by recognition processing under the first read optical conditions.

4. An apparatus according to claim 1, wherein
    said image sensing optical means executes retry processing of performing ID recognition in accordance with a plurality of second read optical conditions different from the first read optical conditions when no ID can be recognized under the first read optical conditions, and
    said recognition processing means adopts, as the ID of the semiconductor wafer, a recognition result under a read optical condition where an evaluation score is not less than an acceptable score and is the highest.

5. An apparatus according to claim 4, further comprising informing means for generating a warning when no ID can be recognized by retry processing under the second read optical conditions.

6. An apparatus according to claim 4, further comprising input means for manually inputting an ID when no ID can be recognized by retry processing under the second read optical conditions.

7. An apparatus according to claim 4, wherein said recognition processing means determines that no ID can be recognized when an evaluation score is under a predetermined value or when an indistinct character exists in a character string of a recognition result.

8. An apparatus according to claim 1, wherein said image sensing optical means comprises:
    a light source which is arranged to irradiate an ID on the semiconductor wafer and changes in irradiation condition in accordance with the first read optical conditions; and
    image sensing means for reading the ID on the semiconductor wafer irradiated by said light source, and
    said recognition processing means comprises:
    read optical condition memory means for storing the first read optical conditions;
    light source control means for controlling said light source so as to set the first read optical conditions stored in said read optical condition memory means;
    ID recognition processing means for performing recognition processing for each of images obtained under the first read optical conditions, calculating an evaluation score for each read optical condition, and storing a recognition result and the evaluation score; and
    determination processing means for adopting, as the ID of the semiconductor wafer, a recognition result which is stored in said ID recognition processing means and is obtained under a read optical condition exhibiting the highest evaluation score.

9. An apparatus according to claim 8, wherein said ID recognition processing means comprises:
    a recognition unit for performing recognition processing for each of images obtained under the first read optical conditions;
    an evaluation unit for calculating an evaluation score for each read optical condition in accordance with an recognition result of said recognition unit; and
    a memory for storing the recognition result of said recognition unit and an evaluation result of said evaluation unit.

10. An apparatus according to claim 1, further comprising transfer means for transferring the semiconductor wafer to a predetermined position on the basis of the ID adopted by said recognition processing means.

11. An apparatus according to claim 1, wherein
the ID includes a first ID formed from code information and a second ID formed from character/numeral information, and
said recognition processing means performs digital recognition processing of the first ID, and when no code can be recognized, performs analog recognition processing of the second ID.

* * * * *